(12) United States Patent
Taguchi

(10) Patent No.: US 11,201,615 B2
(45) Date of Patent: Dec. 14, 2021

(54) CONTROL CIRCUIT AND POWER MODULE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Kazuhiro Taguchi, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 366 days.

(21) Appl. No.: 16/289,396

(22) Filed: Feb. 28, 2019

(65) Prior Publication Data
US 2019/0326898 A1 Oct. 24, 2019

(30) Foreign Application Priority Data
Apr. 24, 2018 (JP) .............................. JP2018-082780

(51) Int. Cl.
*H02P 29/024* (2016.01)
*H03K 17/08* (2006.01)
*H03K 17/082* (2006.01)
*H02M 1/08* (2006.01)

(52) U.S. Cl.
CPC .......... *H03K 17/0822* (2013.01); *H02M 1/08* (2013.01); *H02P 29/024* (2013.01); *H03K 2017/0806* (2013.01)

(58) Field of Classification Search
CPC ................. H02M 1/08; H02P 29/024; H03K 2017/0806; H03K 17/0822
USPC .................................. 318/504; 327/108, 110
See application file for complete search history.

(56) References Cited

U.S. PATENT DOCUMENTS

| | | |
|---|---|---|
| 6,459,380 B1 | 10/2002 | Watanabe et al. |
| 6,934,139 B2 | 8/2005 | Kumagai et al. |
| 2002/0039269 A1* | 4/2002 | Kumagai ........... H03K 17/0828 361/93.1 |

(Continued)

FOREIGN PATENT DOCUMENTS

| | | |
|---|---|---|
| JP | H08-70580 A | 3/1996 |
| JP | 2002-027665 A | 1/2002 |

(Continued)

*Primary Examiner* — William Hernandez
(74) *Attorney, Agent, or Firm* — Kim & Stewart LLP

(57) ABSTRACT

A control circuit for controlling a power semiconductor element includes a temperature detection circuit configured to detect a temperature signal of the power semiconductor element, a current detection circuit configured to detect a current signal flowing through the power semiconductor element, a state determination circuit configured to receive the detected temperature signal and the detected current signal, determine a state of the power semiconductor element based on at least one of the detected temperature signal and the detected current signal, and output one or more output control signals indicating the determined state, and a driver circuit configured to control electric power supplied by the power semiconductor element based on the output control signals.

18 Claims, 10 Drawing Sheets

(56) References Cited

U.S. PATENT DOCUMENTS

| | | | |
|---|---|---|---|
| 2009/0174353 A1* | 7/2009 | Nakamura | H03K 17/0828 318/400.27 |
| 2011/0058297 A1* | 3/2011 | Higashida | H03K 17/0822 361/93.9 |
| 2011/0089919 A1* | 4/2011 | Matsunaga | H03K 17/18 323/282 |
| 2011/0279152 A1* | 11/2011 | Nakahara | H01L 27/0705 327/110 |
| 2012/0019183 A1* | 1/2012 | Sakane | B60L 15/16 318/473 |
| 2017/0019092 A1 | 1/2017 | Taoka | |
| 2018/0269677 A1* | 9/2018 | Yamamura | H02M 1/08 |

FOREIGN PATENT DOCUMENTS

| | | |
|---|---|---|
| JP | 3635988 B2 | 4/2005 |
| WO | 2016/052011 A1 | 4/2016 |

\* cited by examiner

FIG. 2

|  | STATE1 | STATE2 | STATE3 | STATE4 |
|---|---|---|---|---|
| CURRENT DETECTION | NORMAL | ALERT CURRENT OR ALERT TEMPERATURE |  | ERROR CURRENT |
| TEMPERATURE DETECTION | | | ERROR TEMPERATURE | |
| DIAG1 OUTPUT | H | H | L (LATCH) | L (LATCH) |
| DIAG2 OUTPUT | H | L | H | L (LATCH) |
| POWER ELEMENT | CONTINUOUS OPERATION | | STOP | |

FIG. 7

| | STATE1 | STATE2 | STATE3 | STATE4 |
|---|---|---|---|---|
| IN1 (DIAG1) COMMON | H | H | L | L |
| IN2 AND IN3 (DIAG2) | H | L | H | L |
| STATE OF EACH POWER SEMICONDUCTOR ELEMENT | ALL IN NORMAL STATE | ALERT STATE WHEN DIAG2 IS SET TO L | AT LEAST ONE IS ERROR TEMPERATURE STATE - STOP OPERATION | ERROR CURRENT STATE WHEN DIAG2 IS SET TO L - STOP OPERATION |

FIG. 9

| | STATE1 | STATE2 | STATE3 | STATE4 |
|---|---|---|---|---|
| CURRENT DETECTION | NORMAL | ALERT CURRENT OR ALERT TEMPERATURE | | ERROR CURRENT |
| TEMPERATURE DETECTION | | | ERROR TEMPERATURE | |
| DIAG1 OUTPUT | H | H | L (LATCH) | L (LATCH) |
| DIAG2 OUTPUT | H | L | H | L (LATCH) |
| EN INPUT | VALID | INVALID | INVALID | VALID |

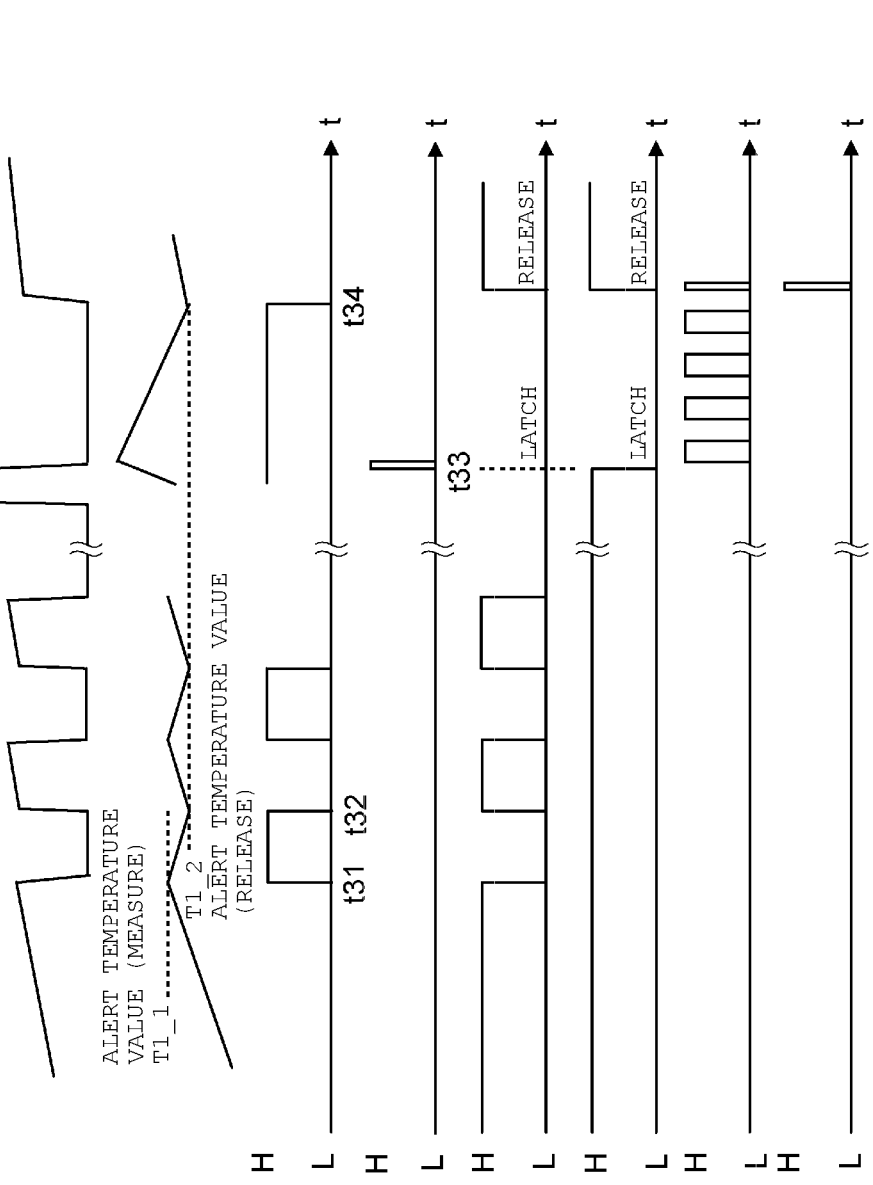

CONTROL CIRCUIT AND POWER MODULE

CROSS-REFERENCE TO RELATED APPLICATION

This application is based upon and claims the benefit of priority from Japanese Patent Application No. 2018-082780, filed Apr. 24, 2018, the entire contents of which are incorporated herein by reference.

FIELD

Embodiments described herein relate generally to a control circuit and a power module.

BACKGROUND

Recently, in order to drive a load requiring a comparatively large electric power such as a motor, a power semiconductor element such as an insulated gate bipolar transistor (IGBT) or a metal-oxide-semiconductor field-effect transistor (MOSFET) has been widely used. A control circuit that controls the power semiconductor element usually has a mechanism for stopping the power semiconductor element when any error occurs in the power semiconductor element. However, a subsequent suitable response to the error may vary depending on the types of errors.

DESCRIPTION OF THE DRAWINGS

FIG. 2 is a diagram illustrating a state of a power semiconductor element according to the first embodiment.

FIG. 7 is a diagram illustrating a state of a power semiconductor element according to the modification example of the first embodiment.

FIG. 9 is a diagram illustrating a state of a power semiconductor element according to the second embodiment.

FIGS. 10A to 10J are timing charts illustrating operations of the power module according to the second embodiment.

DETAILED DESCRIPTION

Embodiments provide a control circuit and a power module capable of determining an error condition.

In general, according to one embodiment, a control circuit for controlling a power semiconductor element includes a temperature detection circuit configured to detect a temperature signal of the power semiconductor element, a current detection circuit configured to detect a current signal flowing through the power semiconductor element, a state determination circuit configured to receive the detected temperature signal and the detected current signal, determine a state of the power semiconductor element based on at least one of the detected temperature signal and the detected current signal, and output one or more output control signals indicating the determined state, and a driver circuit configured to control electric power supplied by the power semiconductor element based on the output control signals.

First Embodiment

A first embodiment will be described hereinafter.

Figure 1:
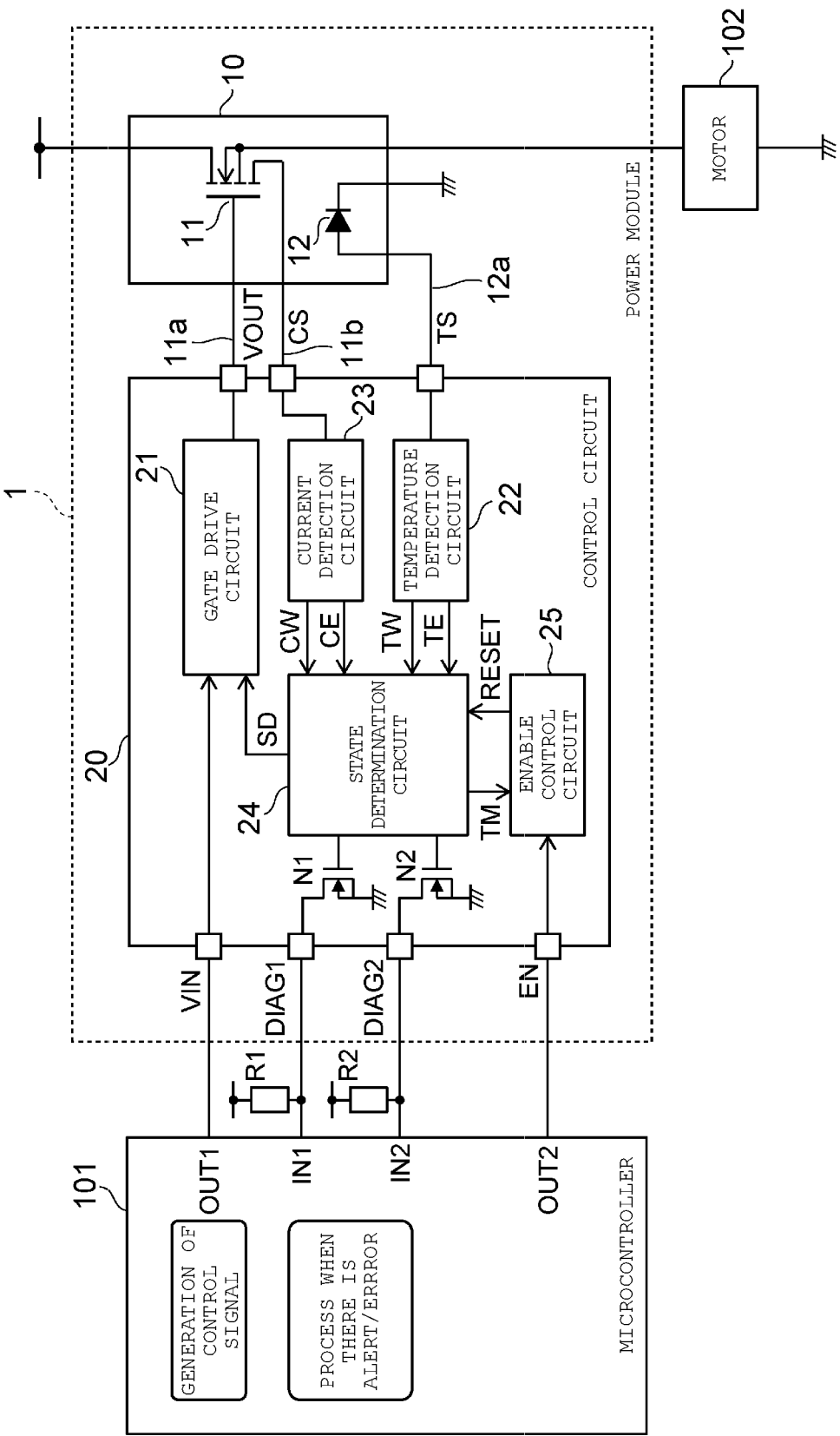
FIG. 1 is a block diagram illustrating a power module according to a first embodiment.
Figure 3:
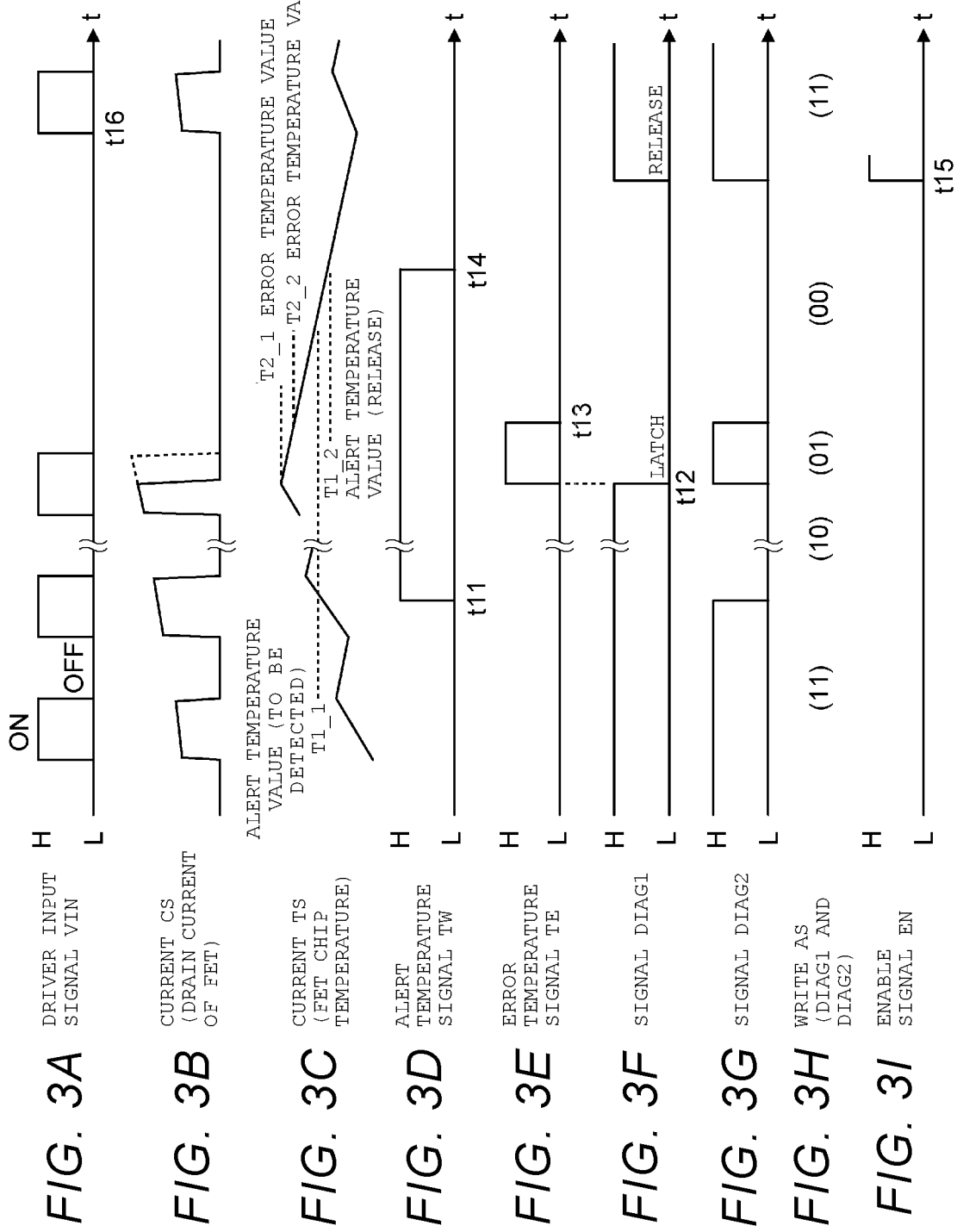
FIGS. 3A to 3I are timing charts illustrating operations of the power module according to the first embodiment at the time of overheating.

FIG. 1 is a block diagram illustrating a power module according to the present embodiment.

FIG. 2 is a diagram illustrating a state of a power semiconductor element according to the present embodiment.

As illustrated in FIG. 1, the power module 1 according to the present embodiment is connected between a microcontroller 101 serving as an external control mechanism and a motor 102 serving as a load to be driven. For example, the microcontroller 101, the power module 1, and the motor 102 make up one actuator. The actuator is, for example, an actuator for driving a wiper of an automobile.

The power module 1 includes a driver circuit 10 and a control circuit 20. The driver circuit 10 and the control circuit 20 are disposed in, for example, one package. The driver circuit 10 and the control circuit 20 may be provided in separate packages. The driver circuit 10 is a switching circuit that supplies electric power to the motor 102. The control circuit 20 is a circuit for controlling the driver circuit 10.

The driver circuit 10 includes a power semiconductor element 11, and a diode 12. The diode 12 is disposed near the power semiconductor element 11, and is disposed in, for example, the same chip.

The power semiconductor element 11 is connected in series to the motor 102 between a power supply potential and a ground potential. The power semiconductor element 11 is an element that controls a magnitude of a drain current flowing based on a gate potential of, for example, an IGBT or a MOSFET. A gate line 11a is connected to a gate of the power semiconductor element 11. For example, a current detection line 11b is branched from a source of the power semiconductor element 11. A part of the drain current of the power semiconductor element 11, for example, approximately one several ten-thousandths of the drain current flows through the current detection line 11b. By measuring a current CS flowing through the current detection line 11b, the amount of current flowing through the power semiconductor element 11 can be detected. The current CS that correlates with the drain current will be described later.

A constant current is supplied to the anode of the diode 12 from the control circuit 20 via a temperature measurement line 12a. The cathode of the diode 12 is connected to a constant potential, for example, the ground potential. Since a voltage between the anode and the cathode of the diode 12 has temperature dependency, if a temperature of the diode 12 increases, the voltage between the anode and cathode of the diode 12 decreases. Thus, by measuring the potential of the temperature measurement line 12a, a temperature TS of the power semiconductor element 11 can be measured.

The control circuit 20 includes a gate drive circuit 21, a temperature measurement circuit 22, a current detection circuit 23, a state determination circuit 24, and an enable control circuit 25. In addition, the control circuit 20 includes open-drain transistors N1 and N2.

Furthermore, the control circuit 20 includes a plurality of terminals for inputting and outputting signals from and to the outside. Specifically, the control circuit includes a drive output terminal that is connected to the gate line 11a and outputs a control signal VOUT which will be described below, a current measurement terminal which is connected to the current detection line 11b and to which a current CS is input, a temperature measurement terminal which is connected to the temperature measurement line 12a and to which a potential indicating the temperature TS is input, a drive input terminal to which a driver input signal VIN is input from the microcontroller 101, a DIAG1 output terminal for outputting a signal DIAG1 which will be described below, a DIAG2 output terminal for outputting a signal DIAG2, and an enable input terminal to which an enable signal EN is input from the microcontroller 101.

The gate drive circuit 21 generates the control signal VOUT, based on the driver input signal VIN input from the microcontroller 101 and applies the control signal to the gate of the power semiconductor element 11 via the gate line 11a. Thereby, the drain current of the power semiconductor element 11 is controlled.

The temperature measurement circuit 22 causes a constant current to flow through the diode 12 via the temperature measurement line 12a and measures the potential of the temperature measurement line 12a. The temperature TS indicated by the potential of the temperature measurement line 12a corresponds to a temperature of the power semiconductor element 11. In other words, the potential of the temperature measurement line 12a is a signal indicating the temperature TS. The temperature measurement circuit 22 compares the temperature TS with an alert temperature value T1 and an error temperature value T2, and outputs an alert temperature signal TW and an error temperature signal TE.

The error temperature value T2 is a temperature by which a state of the power semiconductor element 11 is determined to be erroneous, and if the temperature TS exceeds the error temperature value T2, the power semiconductor element 11 is stopped. The alert temperature value T1 is a temperature which does not stop the power semiconductor element 11 but which does require attention. Thus, the error temperature value T2 is higher than the alert temperature value T1.

The alert temperature signal TW is a binary signal indicating whether or not the temperature TS is equal to or higher than the alert temperature value T1, and the error temperature signal TE is a binary signal indicating whether or not the temperature TS is equal to or greater than the error temperature value T2. When the temperature TS is less than the alert temperature value T1, the temperature measurement circuit 22 sets a value of the alert temperature signal TW to "L" (low), and when the temperature TS is equal to or greater than the alert temperature value T1, the temperature measurement circuit 22 sets the value of the alert temperature signal TW to "H" (high). In addition, when the temperature TS is less than the error temperature value T2, the temperature measurement circuit 22 sets a value of the error temperature signal TE to "L", and when the temperature TS is equal to or greater than the error temperature value T2, the temperature measurement circuit 22 sets the value of the error temperature signal TE to "H".

However, the alert temperature value T1 and the error temperature value T2 are both different in the cases where the temperature TS approaches the value in question from the low temperature side and where the temperature TS approaches from the high temperature side, the value when approaching from the low temperature side being greater than a value when approaching from the high temperature side. That is, the alert temperature value T1_1 for detecting the alert state is greater than the alert temperature value T1_2 for cancelling the alert state, and the error temperature value T2_1 for detecting the error state is greater than the error temperature value T2_2 for cancelling the error state.

The current CS is input to the current detection circuit 23 from the power semiconductor element 11 via the current detection line 1ib. As described, the current CS correlates with (for example, is proportional to) the drain current of the power semiconductor element 11. In other words, the current CS flowing through the current detection line 1ib is a signal indicating the drain current of the power semiconductor element 11. The current detection circuit 23 compares a magnitude of the current CS with an alert current value C1 and an error current value C2, and outputs an alert current signal CW and an error current signal CE.

The error current value C2 is a current indicating that the state of the power semiconductor element 11 is determined to be erroneous, and the power semiconductor element 11 is stopped if the current CS exceeds the error current value C2. The alert current value C1 is a current which does not stop the power semiconductor element 11 but which requires attention. Thus, the error current value C2 is greater than the alert current value C1.

The alert current signal CW is a signal indicating whether or not the current CS is equal to or greater than the alert current value C1, and the error current signal CE is a signal indicating whether or not the current CS is equal to or greater than the error current value C2. When the current CS is less than the alert current value C1, the current detection circuit 23 sets the value of the alert current signal CW to "L", and when the current CS is equal to or greater than the alert current value C1, the current detection circuit 23 sets the value of the alert current signal CW to "H". In addition, when the current CS is less than the error current value C2, the current detection circuit 23 sets the value of the error current signal CE to "L", and when the current CS is equal to or greater than the error current value C2, the current detection circuit 23 sets the value of the error current signal CE to "H".

Figure 4:
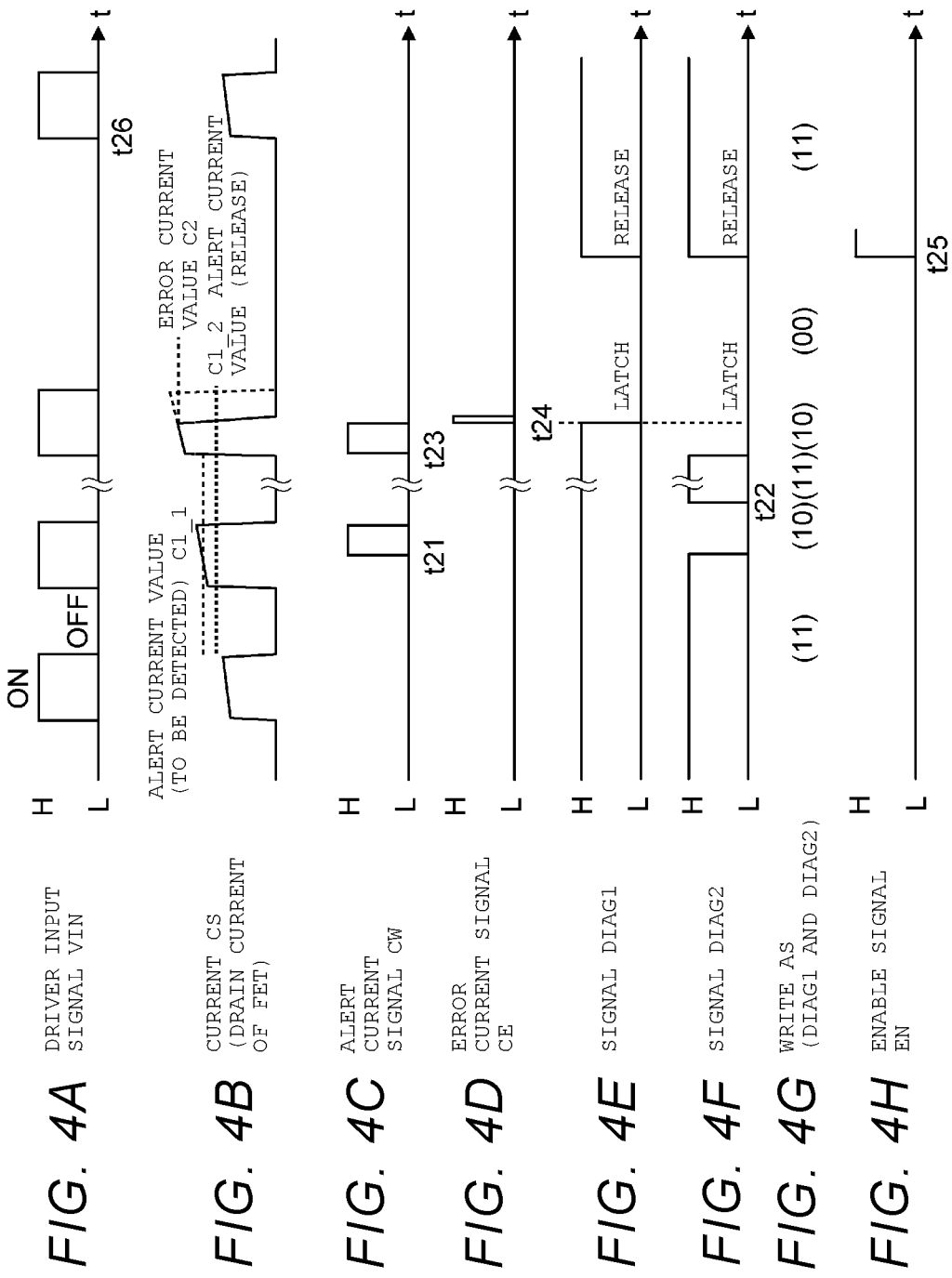
FIGS. 4A to 4H are timing charts illustrating the operations of the power module according to the first embodiment at the time of an overcurrent.

As shown in FIG. 4B, the alert current value for detecting the alert state, shown as C1_1, is greater than the alert current value for cancelling the alert state, shown as C1_2.

As illustrated in FIGS. 1 and 2, the state determination circuit 24 receives the alert temperature signal TW and the error temperature signal TE from the temperature measurement circuit 22 and receives the alert current signal CW and the error current signal CE from the current detection circuit 23, thereby, determining in which of the following states 1 to 4 the power semiconductor element 11 is. A procedure for determining the state will be described later, and only the determination result will be briefly described below.

The "state 1" is a state in which the temperature TS indicated by a potential of the temperature measurement line 12a is less than the alert temperature value T1 and the current CS flowing through the current detection line 11b is less than the alert current value C1. The power semiconductor element 11 is continuously driven in the state 1. Hereinafter, the state 1 is also referred to as a "normal state".

The "state 2" is the "alert temperature state" in which the temperature TS is equal to or greater than the alert temperature value T1 and is less than the error temperature value T2, or is the "alert current state" in which the temperature TS is less than the alert temperature value T1 and the current CS is equal to or greater than the alert current value C1 and is less than the error current value C2. A state in which the temperature TS is equal to or greater than the alert temperature value T1 and is less than the error temperature value T2 and the current CS is equal to or greater than the alert current value C1 and is less than the error current value C2 is included in the "alert temperature state". The power semiconductor element 11 is continuously driven in the state 2, and it is possible to notify the microcontroller 101 of the state 2 and to provide material for a determination to the microcontroller 101. Hereinafter, the state 2 is also referred to as an "alert state".

A "state 3" is a state in which the temperature TS is equal to or greater than the error temperature value T2. Drive of the power semiconductor element 11 is stopped in the state 3. Hereinafter, the state 3 is also referred to as an "error temperature state".

A "state 4" is a state in which the current CS is equal to or greater than the error current value C2. The drive of the power semiconductor element 11 is also stopped in the state 4. Hereinafter, the state 4 is also referred to as an "error current state".

As will be described later, in the present embodiment, when the temperature TS is equal to or greater than the error temperature value T2 and the current CS is equal to or greater than the error current value C2, the state is classified as the state 3. In addition, when the temperature TS is equal to or greater than the alert temperature value T1 and is less than the error temperature value T2 and the current CS is equal to or greater than the error current value C2, the state is classified as state 2. However, if a large current flows through the power semiconductor element 11, the temperature increases inevitably, and the state becomes the state 3 anyway, and drive of the power semiconductor element 11 stops.

The state determination circuit 24 outputs the determined state as the signal DIAG1 and the signal DIAG2 via the open-drain transistors N1 and N2. The signals DIAG1 and DIAG2 are binary signals whose values are "L" or "H". A source of the open-drain transistor N1 is connected to the ground potential, the gate is an input terminal and is connected to the state determination circuit 24, and the drain is an output terminal. The drain is pulled up to the power supply potential via the resistor R1.

Accordingly, if a signal output from the state determination circuit 24 to the gate of the open-drain transistor N1 goes to "L", the open-drain transistor N1 is turned off, the drain is pulled up to the power supply potential via the resistor R1, and a value of the signal DIAG1 becomes "H". Meanwhile, if the signal output from the state determination circuit 24 goes to "H", the open-drain transistor N1 is turned on, the drain is pulled down to the ground potential, and the value of the signal DIAG1 becomes A relationship between the open-drain transistor N2, the resistor R2, and the signal DIAG2 is also the same.

The signal DIAG1 is a signal for distinguishing between normal and error states. Its value is set to "H" in the normal state and the alert state, and is held (i.e., latched) as "L" in the error state. The signal DIAG2 is a signal for distinguishing an error state. Its value is set to "H" in the normal state and the error temperature state, and is set to "L" in the alert state and the error current state. In the error current state, the value of the signal DIAG2 is latched to "L", but in the error temperature state, the value of the signal DIAG2 is not latched, and the measurement result of the temperature is output in real time. As such, the signals DIAG1 and DIAG2 are signals of one bit having separate values of "H" or "L".

Thus, the state determination circuit 24 outputs the discriminated state as a signal having a total of two bits via the two terminals.

Specifically, as illustrated in FIG. 2, in the "state 1" (i.e., the normal state), the state determination circuit 24 sets the value of the signal DIAG1 to "H" and sets the value of the signal DIAG2 to "H". In the "state 2" (i.e., the alert state), the value of the signal DIAG1 is set to "H", and the value of the signal DIAG2 is set to "L". In the "state 3" (i.e., the error temperature state), the value of the signal DIAG1 is set to "L", and the value of the signal DIAG2 is set to "H". At this time, the value of the signal DIAG1 is latched to "L". In the "state 4" (i.e., the error current state), the value of the signal DIAG1 is latched to "L", and the value of the signal DIAG2 is latched to "L".

Furthermore, when the state of the power semiconductor element 11 is the "state 3" or the "state 4", the state determination circuit 24 sets the value of an output stop signal SD output to the gate drive circuit 21 to "H", and stops the power semiconductor element 11. If a reset signal RESET is input, the state determination circuit 24 sets the value of the output stop signal SD to "L". In addition, the state determination circuit 24 outputs a temperature monitor signal TM to the enable control circuit 25 and receives the reset signal RESET from the enable control circuit 25. The value of the temperature monitor signal TM is the same as, for example, a value of the alert temperature signal TW.

The enable control circuit 25 receives an enable signal EN from the microcontroller 101, receives the temperature monitor signal TM from the state determination circuit 24, and outputs the reset signal RESET to the state determination circuit 24. When the value of the temperature monitor signal TM is "L", that is, when the temperature TS is less than the alert temperature value T1, the enable control circuit 25 outputs the reset signal RESET when the enable signal EN is input. The reset signal RESET is a signal for causing the state determination circuit 24 to release the latch and causing the value of the output stop signal SD to return to "L". The gate drive circuit 21 outputs the control signal VOUT if the value of the output stop signal SD is "L" and does not output the control signal VOUT if the value of the output stop signal SD is "H". Meanwhile, when the value of the temperature monitor signal TM is "H", that is, when the temperature TS is equal to or greater than the alert temperature value T1, the enable control circuit 25 outputs the reset signal RESET even if the enable signal EN is input.

The microcontroller 101 controls the power semiconductor element 11 by outputting the driver input signal VIN to the gate drive circuit 21 of the control circuit 20. In addition, by inputting the signals DIAG1 and DIAG2 from the state determination circuit 24 of the control circuit 20, the state of the power semiconductor element 11 is determined, and the enable signal EN is output according to a predetermined program or a command from a master computer. In addition, the microcontroller 101 stores the state of the power semiconductor element 11, measures and accumulates the number of times that the state reaches a certain state. If necessary, a message is sent to a user device.

Next, an operation of the power module 1 according to the present embodiment will be described.

FIGS. 3A to 3I are timing charts illustrating operations of the power module according to the present embodiment at the time of overheating.

FIGS. 4A to 4H are timing charts illustrating operations of the power module according to the present embodiment at the time of overcurrent.

Figure 5:
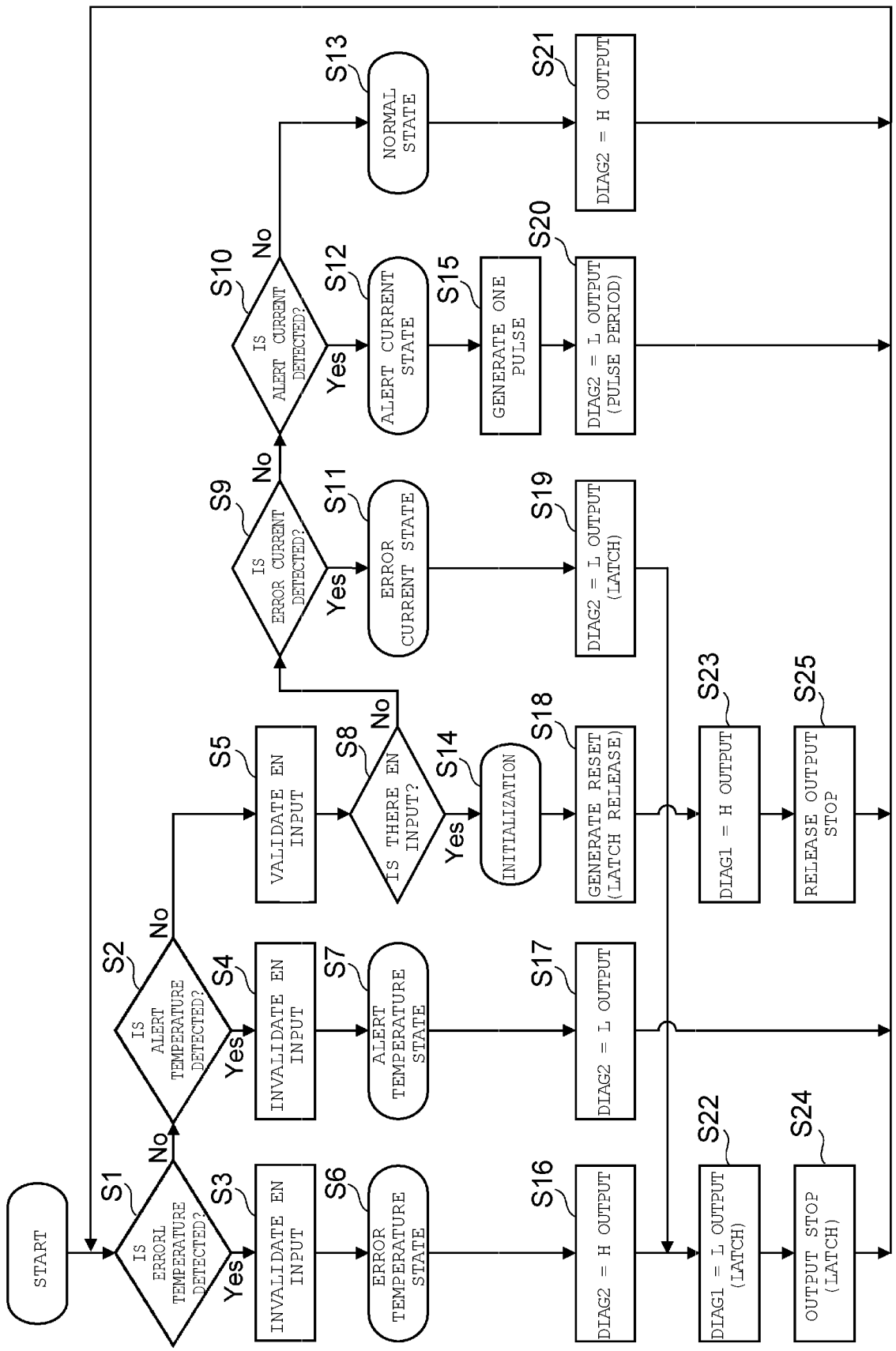
FIG. 5 is a flowchart illustrating operations of a state determination circuit and an enable control circuit according to the first embodiment.

FIG. 5 is a flowchart illustrating operations of the state determination circuit and the enable control circuit according to the present embodiment.

Initial State

In an initial state, the value of the signal DIAG1 is "H", the value of the signal DIAG2 is "H", and the value of the output stop signal SD is Meanwhile, the microcontroller 101 sets the value of the enable signal EN to "L".

During Normal Operation

First, a normal operation will be described.

As illustrated in FIGS. 1, and 3A to 3I, if the microcontroller 101 outputs the driver input signal VIN, the gate drive circuit 21 outputs the control signal VOUT to the gate of the power semiconductor element 11. Thereby, a drain current of the power semiconductor element 11 is controlled, and an operation of the motor 102 is controlled.

At this time, the current CS is input to the current detection circuit 23 from the power semiconductor element 11 via the current detection line 11b. The temperature measurement circuit 22 causes a constant current to flow through the diode 12 via the temperature measurement line 12a and measures a potential of the temperature measurement line 12a. If the temperature varies according to the operation of the power semiconductor element 11, a voltage of the diode 12 varies, and a potential of the temperature measurement line 12a varies. For example, if the temperature of the power semiconductor element 11 increases and the temperature of the diode 12 increases, the voltage of the diode 12 decreases, and the potential of the temperature measurement line 12a decreases.

Since the temperature TS is less than the alert temperature value T1 during a normal operation, the values of the alert temperature signal TW and the error temperature signal TE which are output from the temperature measurement circuit 22 to the state determination circuit 24 are all "L". The value of the temperature monitor signal TM output from the state determination circuit 24 to the enable control circuit 25 is also "L". In addition, since the current CS is less than the alert current value C1, the values of the alert current signal CW and the error current signal CE which are output from the current detection circuit 23 to the state determination circuit 24 are all "L".

Accordingly, as shown in FIG. 5, the process proceeds from step S1 to step S2, and further, proceeds to step S5. As illustrated in step S5, the enable control circuit 25 validates an input of the enable signal EN and proceeds to step S8.

In this stage, since the enable signal EN is not input, that is, since the value is "L", the process proceeds from step S8 to step S9. In addition, since the value of the error current signal CE is "L", the process proceeds from step S9 to step S10. Since the value of the alert current signal CW is also "L", the process proceeds from step S10 to step S13.

As a result, as illustrated in step S13, the state determination circuit 24 determines that the state of the power semiconductor element 11 is the "state 1" (i.e., the normal state). Then, as illustrated in step S21, the value of the signal DIAG2 is maintained as "H" as it is, and the process returns to step S1. Thus, as illustrated in FIG. 2, the value of the signal DIAG1 becomes "H", and the value of the signal DIAG2 becomes "H". During the normal operation, the operations of the above-mentioned steps S1→S2→S5→S8→S9→S10→S13→S21→S1 are repeated. Thereby, the operation of the power semiconductor element 11 is continued.

When Temperature Exceeds Alert Temperature Value

Next, the operation when the temperature TS exceeds the alert temperature value (to be detected) T1_1 will be described.

As illustrated in FIGS. 3A to 3I, it is assumed that the temperature TS exceeds the alert temperature value for detecting the alert state T1_1 at time t11. In this case, since the value of the alert temperature signal TW is "H", the process proceeds from step S2 to step S4 in FIG. 5, and the enable control circuit 25 invalidates an input of the enable signal EN. Thereby, even if the enable signal EN is input from the microcontroller 101, the enable control circuit 25 does not output the reset signal RESET to the state determination circuit 24.

Next, as illustrated in step S7, the state determination circuit 24 determines that a temperature state of the power semiconductor element 11 is the "alert temperature state", and accordingly, determines that a state of the power semiconductor element 11 is the "state 2" (i.e., the alert state). Thereby, as illustrated in FIGS. 3A to 3I and in step S17 of FIG. 5, the value of the signal DIAG2 is changed from "H" to "L". As a result, as illustrated in FIG. 2, the value of the signal DIAG1 is "H", and the value of the signal DIAG2 is "L". Thereafter, the process returns to step S1. As such, in the alert temperature state, the operations of the above-described steps S1→S2→S4→S7→S17→S1 are repeated. The operation of the power semiconductor element 11 is continued.

When Temperature Exceeds Error Temperature Value

Next, an operation when the temperature TS exceeds the error temperature value for detecting the error state T2_1 will be described.

As illustrated in FIGS. 3A to 3I, it is assumed that the temperature TS exceeds the error temperature value T2_1 at time t12. In this case, since the value of the error temperature signal TE is "H", the process proceeds from step S1 to step S3 in FIG. 5, and the enable control circuit 25 invalidates an input of the enable signal EN. In addition, as illustrated in step S6, the state determination circuit 24 determines that the state of the power semiconductor element 11 is the "state 3" (i.e., error temperature state).

Then, as illustrated in step S16, the value of the signal DIAG2 is maintained as "H" as it is, and as illustrated in step S22, the value of the signal DIAG1 is changed from "H" to "L". At this time, the value of the signal DIAG1 is latched at "L" and remains as "L" until the latch is released by the reset signal RESET. As a result, as illustrated in FIG. 2, the value of the signal DIAG1 is latched to "L", and the value of the signal DIAG2 becomes "H". Next, as illustrated in step S24, the state determination circuit 24 sets the value of the output stop signal SD to "H" and stops the gate drive circuit 21. This state is also latched.

Thereby, even if the driver input signal VIN is input, the value of the control signal VOUT is maintained as "L", and the drive of the power semiconductor element 11 stops. As a result, no electric power is supplied to the motor 102, and the motor 102 also stops. Thereafter, the process returns to step S1. As such, in the "state 3" (i.e., the error temperature state), operations of the above-described steps S1→S3→S6→S16→S22→S24→S1 are repeated. The operation of the power semiconductor element 11 is fixed in a stopped state.

When Temperature Decreases Below Error Temperature Value

If the power semiconductor element 11 stops, the power semiconductor element 11 is no longer heated, and the temperature TS decreases. If the temperature TS decreases to be less than the error temperature value for cancelling the error state T2_2 at time t13, since the value of the error temperature signal TE changes from "H" to "L", the process proceeds from step S1 to step S2 in FIG. 5. At this point of time, since the temperature TS is still greater than or equal to the alert temperature value T1_2, the value of the alert temperature signal TW remains as "H" as it is, and the process proceeds from step S2 to step S4. Then, the operation of the above-mentioned "alert temperature state", that is, the operations of steps S1→S2→S4→S7→S17→S1, are repeated. Thereby, in step S17, the value of the signal DIAG2 is switched from "H" to "L", but since the value of the signal DIAG1 is latched, the value remains as "L".

When Temperature Decreases Below Alert Temperature Value

If the temperature of the power semiconductor element 11 further decreases and the temperature TS is less than the alert temperature value for cancelling the alert state T1_2 at time t14, the value of the alert temperature signal TW is switched to "L". Thereby, the process proceeds from step S2 to step S5 in FIG. 5, and the enable control circuit 25 validates an input of the enable signal EN.

Thereafter, it is assumed that the enable signal EN is input from the microcontroller 101 to the enable control circuit 25 at time t15. Thereby, the process proceeds from step S8 to step S14 and is initialized. That is, as illustrated in step S18, the enable control circuit 25 outputs the reset signal RESET to the state determination circuit 24 and releases the latch. Thereby, as illustrated in step S23, the state determination circuit 24 returns the value of the signal DIAG1 to "H", the value of the output stop signal SD is set to "L" as illustrated in step S25, and the output stop of the gate drive circuit 21 is released.

Thereafter, if the microcontroller 101 stops outputting the enable signal EN, the process proceeds from step S8 to steps S9→S10→S13 to determine the "state 1" (i.e., the normal state), and in step S21 the value of the signal DIAG2 returns to "H". Then, operations of the above-described steps S1→S2→S5→S8→S9→S10→S13→S21→S1 are repeated.

Both the values of the signal DIAG1 and the signal DIAG2 become "H", and thereby, the microcontroller 101 recognizes that the "state 1" (i.e., the normal state) is set. Then, at time t16, an output of the driver input signal VIN starts. As a result, the power semiconductor element 11 restarts an operation.

After the "state 3" (i.e., the error temperature state) is set once, the microcontroller 101 determines the timing when the enable signal EN and the driver input signal VIN are output. In the example illustrated in FIGS. 3A to 3I, the enable signal EN is output after the time t14 when the temperature TS decreases to the alert temperature value for cancelling the alert state T1_2, but the enable signal EN may be output when the temperature TS is greater than the alert temperature value T1_2, that is, before the time t14. However, also in this case, initialization is not performed and the output of the gate drive circuit 21 is not restarted until the temperature TS decreases to be less than the alert temperature value T1_2 and the enable control circuit 25 validates an input of the enable signal EN.

When Current Exceeds Alert Current Value

Next, an operation when the current CS exceeds the alert current value C1 will be described.

As illustrated in FIGS. 4A to 4H and FIG. 2, in the initial state, it is assumed that the power semiconductor element 11 is in the "state 1" (i.e., the normal state).

At time t21, it is assumed that the current CS exceeds the alert current value C1. In this case, the value of the alert current signal CW becomes "H". Thereby, in FIG. 5, the process proceeds from step S10 to step S12, the state determination circuit 24 determines that the power semiconductor element 11 is in the "alert current state", that is, the "state 2" (i.e., the alert state), and as illustrated in step S15, after one pulse is generated, the value of the signal DIAG2 is set to "L" as illustrated in step S20. The value of the signal DIAG2 is fixed to "L" during the one pulse. As a result, as illustrated in FIG. 2, the value of the signal DIAG1 becomes "H" and the value of the signal DIAG2 becomes "L".

If the microcontroller 101 sets the value of the driver input signal VIN to "L", the current CS becomes zero and the value of the predictive current signal CW returns to "L". Accordingly, depending on the driver input signal VIN, a period in which the value of the predictive current signal CW is "H" sometimes becomes extremely short. Meanwhile, the value of the signal DIAG2 is maintained as "L" during the one pulse period and returns to "H" at time t22. Thereby, even if the time in which the current CS exceeds the alert current value C1 is short, the value of the signal DIAG2 is maintained as "L" at least during the one pulse period, and thereby, the microcontroller 101 can reliably read that the "state 2" is set. For this purpose, it is preferable that the one pulse is, for example, 100 μsec or more. If the current CS exceeds the alert current value C1 again, the value of the signal DIAG2 becomes "L". As such, if the driver input signal VIN changes intermittently, determination of the state determination circuit 24 reciprocates between the "state 1" and the "state 2", but the power semiconductor element 11 continuously operates.

When Current Exceeds Error Current Value

Next, an operation when the current CS exceeds the error current value C2 will be described.

It is assumed that the current CS exceeds the alert current value C1 and the value of the signal DIAG2 is "L" at time t23. Thereafter, it is assumed that the current CS exceeds the error current value C2 at time t24. Thereby, the value of the error current signal CE becomes "H". In this case, the process proceeds from step S9 in FIG. 5 to step S11, and the state determination circuit 24 determines that the power semiconductor element 11 is in the "state 4" (i.e., the error current state).

Then, as illustrated in step S19, the value of the signal DIAG2 is latched to "L". Next, as illustrated in step S22, the value of the signal DIAG1 is latched to "L". As a result, as illustrated in FIG. 2, the value of the signal DIAG1 is latched to "L" and the value of the signal DIAG2 is latched to "L". Next, as illustrated in step S24, the state determination circuit 24 latches the value of the output stop signal SD at "H" and stops the gate drive circuit 21. Thereby, the power semiconductor element 11 stops and the motor 102 also stops. Thereafter, the process returns to step S1.

At this time, since the power semiconductor element 11 stops, the current CS becomes zero. Thus, the value of the error current signal CE returns to "L", but since the values of the signal DIAG1 and the signal DIAG2 are latched, the values remain as "L" as it is. Thus, until the enable signal EN is input from the microcontroller 101, the state determination circuit 24 maintains the "state 4" (i.e., the error current state) and brings the power semiconductor element 11 to a stop state.

Recovery from Error Current State

Thereafter, the microcontroller 101 performs a predetermined determination and sets the enable signal EN to "H" at time t25. Thereby, the process proceeds from step S8 to step S14, it is determined that "initialization" is performed, the enable control circuit 25 releases the latch by setting the value of the reset signal RESET to "H" as illustrated in step S18, the state determination circuit 24 sets the value of the signal DIAG1 to "H" as illustrated in step S23, and the state determination circuit 24 sets the value of the output stop signal SD to "L" as illustrated in step S25. Thereby, the output stop is cancelled and the gate drive circuit 21 enters a state in which the control signal VOUT can be output.

At this time, if the current CS is normal, that is, if the current CS is less than the alert current value C1, the process proceeds from step S10 to step S12, and it is determined to be the "state 1" (i.e., the normal state). If the driver input signal VIN is input at time t26, the gate drive circuit 21 outputs the control signal VOUT and an operation of the power semiconductor element 11 restarts.

Meanwhile, for example, when the motor 102 is short-circuited and stops, or the like, the current CS exceeds the error current value C2 shortly after the power semiconductor element 11 restarts. In this case, the operations of the above-described steps S9→S11→S19→S22→S24 are performed again, and it is determined to be the "state 4" (i.e., the error current temperature state), and the power semiconductor element 11 stops. For example, the microcontroller 101 counts the number of times that it is determined to be the "state 4", and when the number of times exceeds a predetermined number of times, it is determined that a trouble such as a short circuit occurs, and thereafter, the power semiconductor element 11 is not operated.

Next, effects of the present embodiment will be described.

In the present embodiment, the state determination circuit 24 can output information as to which state the power semiconductor element 11 is in among the four states to an external control mechanism such as the microcontroller 101. Thereby, the microcontroller 101 not only identifies whether the power semiconductor element 11 is in the "normal state" (i.e., state 1) or in the error state (i.e., state 3 and state 4), but also can identify whether or not the power semiconductor element is in the "alert state" (i.e., state 2).

Thereby, the microcontroller 101 can take appropriate preventive measures before the power semiconductor element 11 becomes erroneous and is forced to stop. For example, when the power semiconductor element 11 is in the "alert state" (i.e., state 2), it is possible to prevent an increase in a temperature or a current of the power semiconductor element 11 by adjusting an output of the power semiconductor element 11. As a result, it is possible to avoid or delay occurrence of an error state or to reduce the influence due to a sudden stop of the power semiconductor element 11.

In the present embodiment, it is possible to identify whether the error state is the "error temperature state" (i.e., state 3) or the "error current state" (i.e., state 4). Thereby, the microcontroller 101 can determine whether or not the power semiconductor element 11 needs to restart, and whether or not repetition of the restart is permitted, and can perform restart process according to erroneous conditions.

For example, when the power semiconductor element 11 is in the "error temperature state" (i.e., state 3), the microcontroller continuously monitors the temperature TS until the temperature of the power semiconductor element 11 decreases below the alert temperature value for cancelling the alert state T1_2, and in the meantime, the semiconductor element 11 stops. When the power semiconductor element 11 is in the "error current state" (i.e., state 4), the power semiconductor element 11 temporarily stops and then restarts immediately. If the power semiconductor element operates normally, the power semiconductor element is driven as it is, and when the power semiconductor element repeatedly enters the "error current state" (i.e., state 4), the operation of the power semiconductor element 11 is stopped.

For example, when the motor 102 moves a wiper of an automobile, if the wiper is physically restrained by accumulated snow or freezing, a load is applied to the power semiconductor element 11, which may result in an error temperature state. In this case, as described above, although the control circuit 20 temporarily stops the power semiconductor element 11, if the stopped state is maintained, transparency of a front window decreases, and an operation of the automobile becomes difficult. Accordingly, it is preferable to drive the motor 102 at an appropriate timing and to attempt an operation of the wiper.

Meanwhile, when a circuit including the power semiconductor element 11 and the motor 102 is short-circuited, even if the power semiconductor element 11 restarts, only a large current flows every time. In such a case, if the power semiconductor element 11 restarts many times, a current of the motor increases, which not only shortens a life time of the power semiconductor element 11 but also can cause a serious situation such as smoking or ignition. Accordingly, it is preferable to restart only a small number of times and to notify a user of the necessity of repair.

As such, according to the present embodiment, it is possible to perform treatment depending on the situation, and to protect the power semiconductor element 11 while preventing the influence on the entire system including the power module 1. As such, according to the present embodiment, it is possible to achieve the control circuit and the power module 1 capable of determining the erroneous condition.

Furthermore, in the present embodiment, in the "state 3" (i.e., the error temperature state), the value of the signal DIAG2 is not latched, and the temperature is measured in real time. Thereby, it is possible to accurately detect the actual situation. Meanwhile, in the "state 4" (i.e., the error current state), the value of the signal DIAG2 is latched and the information of the current CS immediately before the stop is held. This is because, if the power semiconductor element 11 stops, the current CS becomes zero, and thereby, if the current is measured in real time, determination of the "state 4" cannot be maintained.

Furthermore, in the present embodiment, four states are transmitted by a two-bit signal from the control circuit to the microcontroller 101. Accordingly, the time required for the microcontroller 101 to recognize the state can be shortened, and a high-speed response can be made. If it is attempted to transmit the state of the power semiconductor element 11 by using a digital signal for transmitting information by changing a pulse width, the microcontroller 101 needs to sample the digital signal for a predetermined period, and thereby, it is necessary to provide a complicated reception element and it takes time to read information. In contrast to this, according to the present embodiment, since the binary signal whose value is "H" or "L" is merely transmitted via two wires, information can be instantaneously read by a simple element.

Modification Example of First Embodiment

Next, a modification example of the first embodiment will be described.

Figure 6:
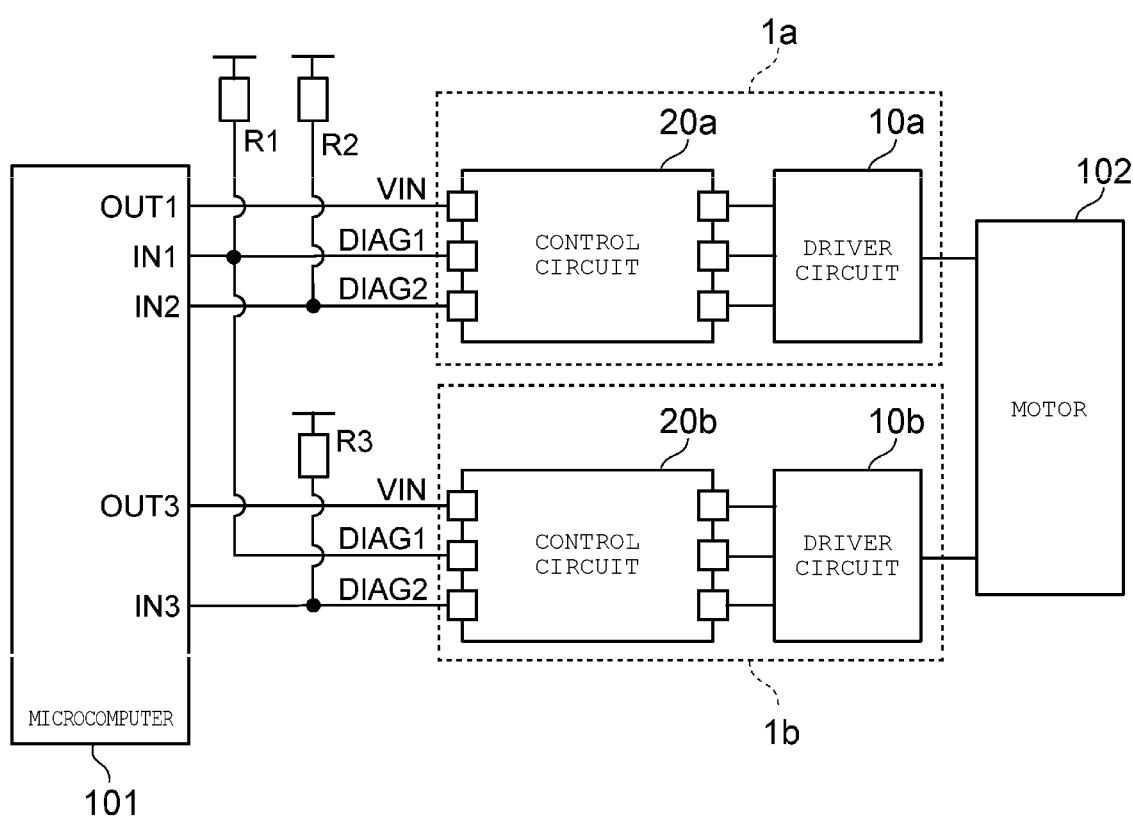
FIG. 6 is a block diagram illustrating a power module according to a modification example of the first embodiment.

FIG. 6 is a block diagram illustrating a power module according to the present modification example.

As illustrated in FIG. 6, in the present modification example, two power modules 1a and 1b are connected to one microcontroller 101. Configurations of the power modules 1*a* and 1*b* are the same as the configuration of the power module 1 according to the first embodiment described above, respectively. That is, the power module 1*a* includes a driver circuit 10*a* and a control circuit 20*a*, and the power module 1*b* includes a driver circuit 10*b* and a control circuit 20*b*. The driver circuit 10*a* and 10*b* drive, for example, one motor 102. For example, the driver circuit 10*a* forwardly rotates the motor 102, and the driver circuit 10*b* reversely rotates the motor 102.

The microcontroller 101 includes two output terminals OUT1 and OUT3 and three input terminals IN1, IN2, and IN3. The output terminal OUT1 outputs the driver input signal VIN to the control circuit 20*a*. The output terminal OUT3 outputs the driver input signal VIN to the control circuit 20*b*. Meanwhile, the signal DIAG1 of the control circuit 20*a* and the signal DIAG1 of the control circuit 20*b* are input to the input terminal IN1. That is, the signals DIAG1 of each control circuit are input to the common input terminal of the microcontroller 101. The signal DIAG2 of the control circuit 20*a* is input to the input terminal IN2. The signal DIAG2 of the control circuit 20*b* is input to the input terminal IN3. That is, the signals DIAG2 of each control circuit is input to mutually different input terminals of the microcontroller 101. Resistors R1 to R3 are connected between each wire connected to the input terminals IN1 to IN3 and the power supply potentials of the microcontroller 101, respectively.

Next, an operation of the power module according to the present modification example will be described.

FIG. 7 is a diagram illustrating states of the power semiconductor element according to the present modification example.

As illustrated in FIG. 1, since the signal DIAG1 is connected to the drain of the open-drain transistor N1, if the open-drain transistor N1 is turned on, the signal DIAG1 becomes the ground potential. Accordingly, as illustrated in FIG. 6, if a value of the signal DIAG1 of either one of the control circuits 20*a* and 20*b* becomes "L", a potential of the input terminal IN1 becomes "L". As illustrated in FIG. 7, in the present modification example, the microcontroller 101 determines the state of the power semiconductor element 11 according to the following rules.

The "state 1" is a case where the value of the signal DIAG1 is "H" and the value of the signal DIAG2 is "H" for both of the power modules 1*a* and 1*b*. In this case, both the power modules 1*a* and 1*b* are in the "normal state".

The "state 2" is a case where the value of the signal DIAG1 is "H" and the value of the signal DIAG2 is "L" for at least one of the power modules 1*a* and 1*b*. In this case, the power module in which the value of the signal DIAG2 is "L" is in the "alert state".

The "state 3" is a case where the value of the signal DIAG1 is "L" and the value of the signal DIAG2 is "H" for both the power modules 1*a* and 1*b*. In this case, the value of the signal DIAG1 is "L" for at least one of the power modules 1*a* and 1*b*. That is, at least one of the power modules is in the "error temperature state" and the operation stops.

The "state 4" is a case where the value of the signal DIAG1 is "L" and the value of the signal DIAG2 is "L" for at least one of the power modules 1*a* and 1*b*. In this case, the power module having the value of the signal DIAG2 set to "L" is in the "error current state" and an operation thereof stops.

Next, effects of the present modification example will be described.

According to the present modification example, it is possible to reduce the number of wires by sharing the input terminal for the signal DIAG1, as compared with a case where the input terminal for the signal DIAG1 is provided for each power module. Thereby, it is possible to select a microcontroller having a small number of ports, which can reduce the cost and simplify wiring, and thereby, maintainability is improved.

Structures, operations, and effects other than those described above in the present modification example are the same as those in the first embodiment.

In the present modification example, an example in which two power modules 1*a* and 1*b* are connected to one microcontroller 101 is described, and the present disclosure is not limited to this, and three or more power modules may be connected thereto. In this case, for example, the signals DIAG1 are input to the common input terminal, and the signals DIAG2 are input to mutually different input terminals. Thereby, assuming that the number of power modules connected to one microcontroller 101 is N (N is an integer equal to or larger than 1), one wire is used for the signals DIAG1, N wires are used for the signals DIAG2, and wires required for transmitting a state can be a total of (N+1) wires. However, depending on the configuration, the signals DIAG2 can also be used in common, and in that case, the number of wires is reduced.

Second Embodiment

Next, a second embodiment will be described.

Figure 8:
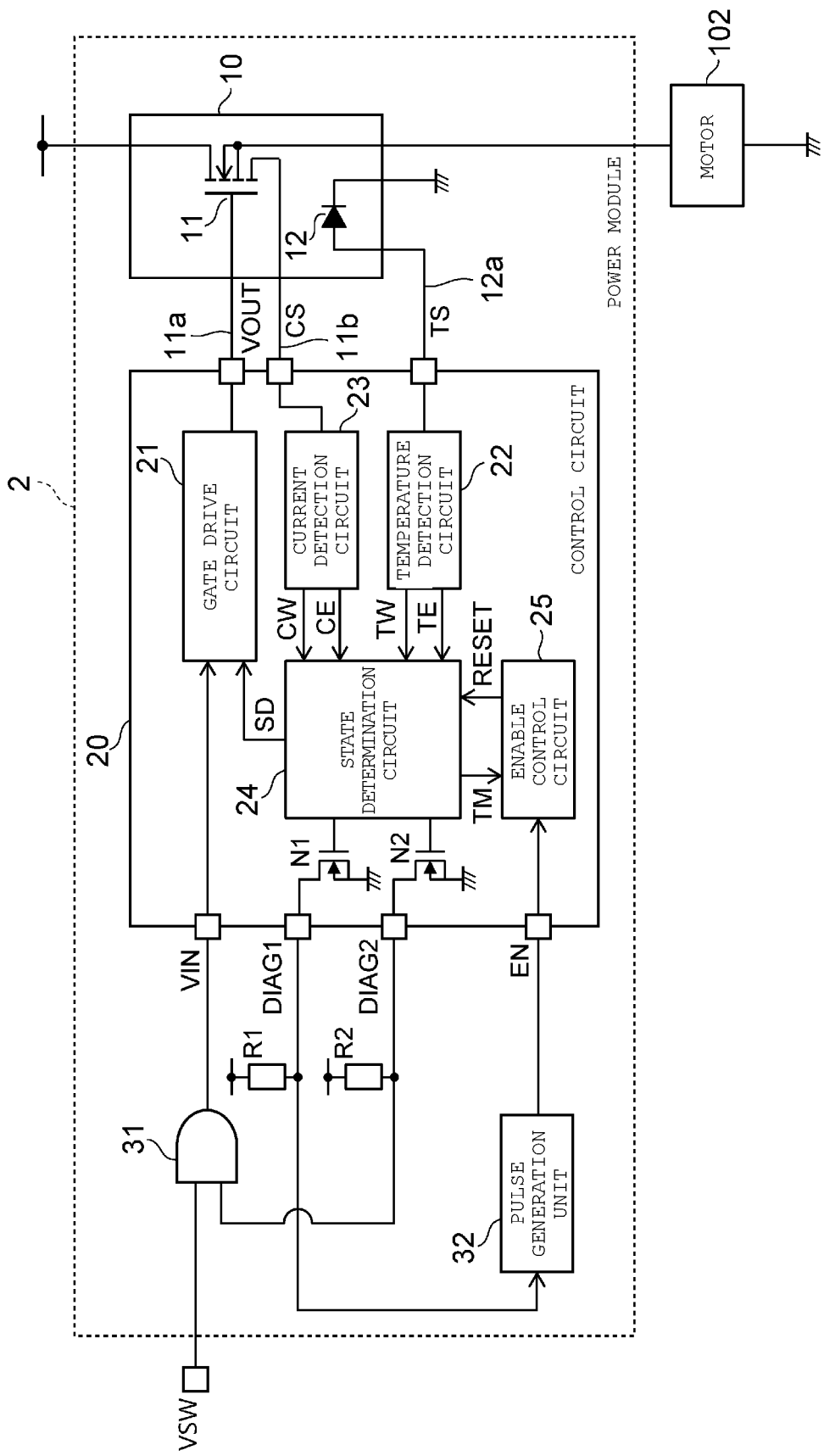
FIG. 8 is a block diagram illustrating a power module according to a second embodiment.

FIG. 8 is a block diagram illustrating a power module according to the present embodiment.

As illustrated in FIG. 8, a power module 2 according to the present embodiment is not connected to an external control device such as a microcontroller. In addition to the configuration of the power module 1 according to the first embodiment, the power module 2 includes an AND gate circuit 31 and a pulse generation unit 32. The pulse generation unit 32 is, for example, a multivibrator.

The AND gate circuit 31 receives an input signal VSW from the outside and the signal DIAG2 from the state determination circuit 24, and outputs a logical product of the input signal VSW and the signal DIAG2 as the driver input signal VIN. That is, a value of the driver input signal VIN is "H" if both the values of the input signal VSW and the signal DIAG2 are "H", and is "L" in the other cases.

When the signal DIAG1 is input and the value of the signal DIAG1 is "L", the pulse generation unit 32 outputs a pulse signal to the enable control circuit 25 as the enable signal EN. When the value of the signal DIAG1 is "H", the pulse signal is not output and a value of the enable signal EN is maintained as "L".

Next, an operation of the power module according to the present embodiment will be described.

FIG. 9 is a diagram illustrating states of the power semiconductor element according to the present embodiment.

FIGS. 10A to 10J are timing charts illustrating the operations of the power module according to the present embodiment.

A flowchart illustrating the operations of the state determination circuit and the enable control circuit according to the present embodiment is the same as the flowchart in FIG. 5.

Initial State

In the present embodiment, an initial state is the same as in the first embodiment, the value of the signal DIAG1 is "H", the value of the signal DIAG2 is "H", the value of the output stop signal SD is "L", and the value of the enable signal EN is "L". Hereinafter, description will be made with reference to FIGS. 8 to 10J and 5.

During Normal Operation

The signal DIAG2 having a value "H" is input to the AND gate circuit 31. In addition, the input signal VSW is input to the AND gate circuit 31 from the outside. Accordingly, the AND gate circuit 31 outputs the driver input signal VIN having the same value as the input signal VSW to the gate drive circuit 21. Thereby, the power semiconductor element 11 is driven and the motor 102 is driven. At this time, since the value of the signal DIAG1 is "H", the pulse generation unit 32 does not output the enable signal EN. However, the enable control circuit 25 validates an input of the enable signal EN.

Operations other than those described above at the time of the normal operation are the same as the operations of the first embodiment. That is, the state determination circuit 24 and the enable control circuit 25 repeat operations of steps S1→S2→S5→S8→S9→S10→S13→S21→S1 in FIG. 5, determine the state of the power semiconductor element 11 as the "state 1", and makes the power semiconductor element 11 continuously operate.

When Temperature Exceeds Alert Temperature Value

It is assumed that the temperature TS exceeds the alert temperature value for detecting the alert state T1_1 at time t31. In this case, the temperature measurement circuit 22 sets the value of the alert temperature signal TW to "H", and the state determination circuit 24 sets the value of the temperature monitor signal TM to "H". Thereby, the process proceeds from step S2 to step S4 in FIG. 5, and the enable control circuit 25 invalidates an input of the enable signal EN.

In addition, as illustrated in step S7, the state determination circuit 24 determines that the state of the power semiconductor element 11 is the "alert temperature state", and accordingly, determines the state as the "state 2" (i.e., the alert state). Thereby, as illustrated in FIG. 9 and in step S17 of FIG. 5, the value of the signal DIAG2 is changed to "L". As a result, regardless of the value of the input signal VSW, the value of the driver input signal VIN becomes "L", and the power semiconductor element 11 stops. Thereafter, the process returns to step S1. As such, in the alert state, operations of the above-described steps S1→S2→S4→S7→S17→S1 are repeated in the same manner as the first embodiment described above, and the power semiconductor element 11 stops unlike the first embodiment. In the present embodiment, the power semiconductor element 11 is not driven during a period when the temperature TS is equal to or greater than the alert temperature value.

As such, if the temperature TS reaches the alert temperature value for detecting the alert state T1_1, since the power semiconductor element 11 stops, the temperature TS decreases and normally the temperature does not reach an error temperature state. The operations when the temperature TS increases to a temperature equal to or greater than the error temperature value for some reason and when the temperature TS decreases to a temperature less than the error temperature value is the same as in the first embodiment.

When Temperature Decreases Below Alert Temperature Value

If the temperature TS is less than the alert temperature value for cancelling the alert state T1_2 at time t32, the value of the alert temperature signal TW and the value of the temperature monitor signal TM return to "L". Thereby, the process proceeds from step S2 to step S5, and the enable control circuit 25 validates the input of the enable signal EN. In addition, as illustrated in step S13, the state determination circuit 24 determines that the "state 1" (i.e., the normal state) is set and sets the value of the signal DIAG2 to "H" as illustrated in step S21. Thereby, the AND gate circuit 31 outputs the driver input signal VIN having the same value as the input signal VSW to the gate drive circuit 21 and restarts driving the power semiconductor element 11.

Thereafter, if the temperature TS reaches the alert temperature value for detecting the alert state T1_1 again with the drive of the power semiconductor element 11, the "state 2" is set. As illustrated in FIGS. 10A to 10J, after the time t32, the temperature TS reciprocates between the alert temperature value T1_2 and the alert temperature value T1_1, and repeats the "state 1" and the "state 2". By doing so, the temperature TS can be made less than the alert temperature value T1_1.

When Current Exceeds Error Current Value

Next, the operation when the current CS exceeds the error current value C2 will be described.

For example, it is assumed that the current CS exceeds the error current value C2 due to a sudden trouble such as a short circuit at time t33. In this case, the process proceeds from step S9 to step S19 through step S11, and the value of the signal DIAG2 is latched to "L". Thereby, the value of the driver input signal VIN is fixed to "L", and the power semiconductor element 11 stops.

Generally, if a large current flows through the power semiconductor element 11, the temperature TS exceeds the alert temperature value T1_1. Even if the temperature TS is less than the alert temperature value T1_1, if the value of the signal DIAG2 becomes "H" in step S21, the power semiconductor element 11 restarts an operation, a large current flows, and the operation is stopped. By doing so, the large current intermittently flows through the power semiconductor element 11, and thereby, the temperature TS increases to exceed the alert temperature value T1_1. Thus, the value of the temperature monitor signal TM finally becomes "H".

Thereafter, the process proceeds from step S19 to step S22, and the value of the signal DIAG1 is latched to "L". Thereby, the pulse generation unit 32 outputs a pulse signal as the enable signal EN. However, since the value of the temperature monitor signal TM is "H", the enable control circuit 25 does not output the reset signal RESET. Thus, the power semiconductor element 11 does not restart an operation.

Recovery Operation

Thereafter, the power semiconductor element 11 is cooled, and if the temperature TS is less than the alert temperature value for cancelling the alert state T1_2 at time t34, the process proceeds to steps S1→S2→S5→S8→S14, and initialization is performed. That is, as illustrated in step S18, the enable control circuit 25 outputs the reset signal RESET to release the latch, the value of the signal DIAG1 becomes "H" as illustrated in step S23, and the pulse generation unit 32 stops the enable signal EN. In addition, as illustrated in step S25, the state determination circuit 24 sets the output stop signal SD to "L".

Thereafter, the process returns to step S1 to proceed from step S2→S5→S8→S9. If the current CS is less than the error current value C2, the process proceeds to step S10. If the current CS is less than the alert current value C1, the process proceeds to step S13. After it is determined that the "state 1" (i.e., the normal state) is set, the process proceeds to step S21, and the value of the signal DIAG2 is set to "H".

Thereby, the AND gate circuit restarts outputting the driver input signal VIN and restarts operating the power semiconductor element 11.

Next, effects of the present embodiment will be described.

According to the present embodiment, the power module 2 repeats the "state 1" and the "state 2" even without an external control mechanism such as the microcontroller 101, and thereby, it is possible to avoid the "state 3" (i.e., the error temperature state). In addition, the power module 2 autonomously can restart from the "state 4" (i.e., the error current state) and can return to the "state 1" (i.e., the normal state). Thereby, the present embodiment can also be applied to a simple actuator without a microcontroller, such as an actuator that merely transmits an operation of the driver to a motor like a power seat of an automobile, and a state of the power semiconductor element 11 can be appropriately managed.

Structures, operations, and effects other than those described above in the present embodiment are the same as those in the first embodiment.

In the present embodiment, the value of the temperature monitor signal TM coincides with the value of the alert temperature signal TW, but the present disclosure is not limited to this. In the present embodiment, since the driver input signal VIN is controlled by the signal DIAG2 and the AND gate circuit 31, the predictive current signal CW or the error current signal CE may be used instead of the temperature monitor signal TM, and can be appropriately selected according to practical requirements.

In addition, in the present embodiment, the AND gate circuit 31 and the pulse generation unit 32 are provided outside the control circuit 20, but they may be provided in the control circuit 20. Also in this case, the same effect can be obtained. Furthermore, in the examples illustrated in FIGS. 1 and 9, an example in which the motor 102 is connected between the driver circuit 10 and the ground potential (GND) is illustrated, but the motor 102 may be connected between the driver circuit 10 and the power supply potential. A load to be driven is not limited to the motor 102, and may be, for example, a solenoid. Furthermore, a charge pump circuit may be provided between the driver circuit 10 and the motor 102.

According to the above-described embodiments, it is possible to achieve a control circuit and a power module capable of determining the erroneous condition.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A control circuit for controlling a power semiconductor element, the control circuit comprising:
   a temperature detection circuit configured to generate a temperature signal based on a temperature of the power semiconductor element;
   a current detection circuit configured to generate a current signal based on a current flowing through the power semiconductor element;
   a state determination circuit configured to receive the temperature signal and the current signal, determine a state of the power semiconductor element based on at least one of the temperature signal and the current signal, and output one or more output control signals indicating the determined state; and
   a driver circuit configured to control electric power supplied by the power semiconductor element based on the output control signals, wherein
   the state of the power semiconductor element determined by the state determination circuit includes:
      a first state when the temperature signal indicates a temperature value less than a first temperature value and the current signal indicates a current value less than a first current value,
      a second state when the temperature signal indicates a temperature value equal to or greater than the first temperature value and less than a second temperature value greater than the first temperature value, or the current signal indicates a current value equal to or greater than the first current value and less than a second current value greater than the first current value,
      a third state when the temperature signal indicates a temperature value equal to or greater than the second temperature value, and
      a fourth state when the current signal indicates a current value equal to or greater than the second current value.

2. The control circuit according to claim 1, wherein during the first state or the second state, the driver circuit controls the power semiconductor element to continue to supply the electric power.

3. The control circuit according to claim 1, wherein during the third state or the fourth state, the driver circuit controls the power semiconductor element to stop supplying the electric power.

4. The control circuit according to claim 3, further comprising:
   an enable control circuit configured to receive an enable signal, wherein
   once the state determination circuit has determined that the state is the third state or the fourth state and then the first state, the driver circuit controls the power semiconductor element to restart the supply of the electric power only when the enable control circuit receives the enable signal.

5. The control circuit according to claim 3, wherein during the third state, the driver circuit controls the power semiconductor element to stop supplying the electrical power regardless of receipt of the enable signal.

6. The control circuit according to claim 1, wherein the first temperature value when the current state is the first state is different from the first temperature value when the current state is the second or third state.

7. The control circuit according to claim 6, wherein the second temperature value when the current state is the first or second state is different from the second temperature value when the current state is the third state.

8. The control circuit according to claim 1, wherein the output control signals include first and second output signals,
   a value of the first output signal when the state is the first state or the second state is different from a value of the first output signal when the state is the third state or the fourth state, and a value of the second output signal when the state is the first state or the third state is different from a value of the second output signal when the state is the second state or the fourth state.

9. The control circuit according to claim 8, wherein
an enable control circuit configured to receive an enable signal and output a reset signal to the state determination circuit based on the enable signal,
the state determination circuit is configured to
not latch the value of the second output signal when the state is the third state, and
latch the value of the second output signal when the state is the fourth state, and release the latch upon receipt of the reset signal.

10. A power module comprising:
a power semiconductor element configured to supply power to a motor; and
a control circuit comprising
a temperature detection circuit configured to generate a temperature signal based on a temperature of the power semiconductor element,
a current detection circuit configured to generate a current signal based on a current flowing through the power semiconductor element,
a state determination circuit configured to receive the temperature signal and the current signal, determine a state of the power semiconductor element based on at least one of the temperature signal and the current signal, and output one or more output control signals indicating the determined state, and
a driver circuit configured to control the power based on the output control signals, wherein
the state of the power semiconductor element determined by the state determination circuit includes:
a first state when the temperature signal indicates a temperature value less than a first temperature value and the current signal indicates a current value less than a first current value,
a second state when the temperature signal indicates a temperature value equal to or greater than the first temperature value and less than a second temperature value greater than the first temperature value, or the current signal indicates a current value equal to or greater than the first current value and less than a second current value greater than the first current value,
a third state when the temperature signal indicates a temperature value equal to or greater than the second temperature value, and
a fourth state when the current signal indicates a current value equal to or greater than the second current value.

11. The power module according to claim 10, wherein during the first state or the second state, the driver circuit controls the power semiconductor element to continue to supply the power.

12. The power module according to claim 10, wherein during the third state or the fourth state, the driver circuit controls the power semiconductor element to stop supplying the power.

13. The power module according to claim 12, further comprising:
an enable control circuit configured to receive an enable signal, wherein once the state determination circuit has determined that the state is the third state or the fourth state and then is the first state, the driver circuit controls the power semiconductor element to restart the supply of the power only when the enable control circuit receives the enable signal.

14. The power module according to claim 12, wherein during the third state, the driver circuit controls the power semiconductor element to stop supplying the power regardless of receipt of the enable signal.

15. The power module according to claim 10, wherein the first temperature value when the current state is the first state is different from the first temperature value when the current state is the second or third state, and
the first current value when the current state is the first state is different from the first current value when the current state is the second or the fourth state.

16. The power module according to claim 15, wherein the second temperature value when the current state is the first or second state is different from the second temperature value when the current state is the third state, and
the second current value when the current state is the first or second state is different from the second current value when the current state is the fourth state.

17. The power module according to claim 10, wherein the output control signals include first and second output signals,
a value of the first output signal when the state is the first state or the second state is different from a value of the first output signal when the state is the third state or the fourth state, and
a value of the second output signal when the state is the first state or the third state is different from a value of the second output signal when the state is the second state or the fourth state.

18. A power module comprising:
a power semiconductor element configured to supply power to an external device;
a control circuit comprising
a temperature detection circuit configured to generate a temperature signal based on a temperature of the power semiconductor element,
a current detection circuit configured to generate a current signal based on a current flowing through the power semiconductor element,
a state determination circuit configured to receive the temperature signal and the current signal, determine a state of the power semiconductor element based on at least one of the temperature signal and the current signal, and output first and second output control signals according to the determined state, and
a driver circuit configured to control the power supplied by the power semiconductor element; and
a pulse generation unit configured to output a pulse signal to the state determination circuit based on the first output control signal; and
an AND gate circuit configured to output a logical product of an input signal and the second output control signal to the driver circuit, wherein
the driver circuit is configured to control the power based on the determined state and the logical product output from the AND gate circuit.

* * * * *